US012248859B2

(12) United States Patent
Blanton et al.

(10) Patent No.: US 12,248,859 B2
(45) Date of Patent: Mar. 11, 2025

(54) INTEGRATED CIRCUIT DEFECT DIAGNOSIS USING MACHINE LEARNING

(71) Applicant: Carnegie Mellon University, Pittsburgh, PA (US)

(72) Inventors: Ronald D. Blanton, Pittsburgh, PA (US); Soumya Mittal, Pittsburgh, PA (US)

(73) Assignee: Carnegie Mellon University, Pittsburgh, PA (US)

(*) Notice: Subject to any disclaimer, the term of this patent is extended or adjusted under 35 U.S.C. 154(b) by 992 days.

(21) Appl. No.: 16/986,963

(22) Filed: Aug. 6, 2020

(65) Prior Publication Data

US 2021/0042644 A1 Feb. 11, 2021

Related U.S. Application Data

(60) Provisional application No. 62/922,401, filed on Aug. 7, 2019.

(51) Int. Cl.
*G06N 20/20* (2019.01)
*G06F 11/07* (2006.01)
*G06N 3/06* (2006.01)
*G06N 5/04* (2023.01)
*G06N 20/00* (2019.01)

(52) U.S. Cl.
CPC ......... *G06N 20/20* (2019.01); *G06F 11/0751* (2013.01); *G06F 11/0766* (2013.01); *G06N 3/06* (2013.01); *G06N 5/04* (2013.01); *G06N 20/00* (2019.01)

(58) Field of Classification Search
CPC .......... G06N 5/04; G06N 20/00; G06N 20/20; G06N 3/06; G06F 11/0751; G06F 11/0766
See application file for complete search history.

(56) References Cited

U.S. PATENT DOCUMENTS

| | | | |
|---|---|---|---|
| 6,513,025 B1* | 1/2003 | Rosen | G06N 5/025 706/45 |
| 8,402,421 B2* | 3/2013 | Bartenstein | G06F 11/2205 714/33 |
| 10,592,625 B1* | 3/2020 | Tang | G01R 31/2894 |
| 10,598,730 B1* | 3/2020 | Chen | G01R 31/318547 |
| 10,657,207 B1* | 5/2020 | Tang | G06F 30/333 |
| 10,699,055 B2* | 6/2020 | Sha | G06N 3/047 |
| 10,795,751 B2* | 10/2020 | Tang | G01R 31/2837 |
| 12,001,973 B2* | 6/2024 | Veda | G01R 31/318566 |
| 2006/0005094 A1* | 1/2006 | Nozuyama | G01R 31/31835 714/738 |

(Continued)

OTHER PUBLICATIONS

Extraction and Simulation of Realistic CMOS Faults using Inductive Fault Analysis by F. Joel Ferguson and John P. Shen (Year: 1988).*

(Continued)

*Primary Examiner* — Miranda M Huang
*Assistant Examiner* — Chase P. Hinckley
(74) *Attorney, Agent, or Firm* — KDW Firm PLLC

(57) ABSTRACT

A three-phase diagnosis methodology capable of effectively diagnosing and classifying multiple defects in integrated circuits comprises a first phase identifying a defect that resembles traditional fault models, and second and third phases that utilize the X-fault model and machine learning to identify correct candidates.

10 Claims, 12 Drawing Sheets

(56) References Cited

U.S. PATENT DOCUMENTS

| | | | | |
|---|---|---|---|---|
| 2006/0066338 | A1* | 3/2006 | Rajski | G01R 31/31704 714/738 |
| 2007/0100586 | A1* | 5/2007 | Cheng | G01R 31/318547 702/185 |
| 2015/0204939 | A1* | 7/2015 | Hsueh | G01R 31/318371 702/58 |
| 2018/0300434 | A1* | 10/2018 | Hu | G03F 7/70508 |
| 2019/0087526 | A1* | 3/2019 | Park | G06N 20/00 |
| 2019/0155164 | A1* | 5/2019 | Chen | G01N 21/8851 |
| 2019/0220776 | A1* | 7/2019 | Huang | G01R 31/318583 |
| 2019/0236240 | A1* | 8/2019 | Huang | G06N 20/20 |
| 2019/0286506 | A1* | 9/2019 | Cheng | G06F 11/0793 |
| 2019/0311290 | A1* | 10/2019 | Huang | G01R 31/317 |
| 2020/0065234 | A1* | 2/2020 | Letombe | G06F 11/3684 |
| 2020/0193282 | A1* | 6/2020 | Tzoufras | G06N 3/063 |
| 2020/0226742 | A1* | 7/2020 | Sawlani | H01L 21/67288 |
| 2020/0302321 | A1* | 9/2020 | Veda | G06F 30/367 |
| 2020/0371858 | A1* | 11/2020 | Hayakawa | G06F 11/0778 |
| 2020/0379041 | A1* | 12/2020 | Li | G06F 30/398 |
| 2021/0350055 | A1* | 11/2021 | Goel | G11C 29/36 |

OTHER PUBLICATIONS

Wang et He, "Improving Test and Diagnosis Efficiency through Ensemble Reduction and Learning" May 2019, pp. 1-26. (Year: 2019).*

Niewenhuis, Benjamin "A Logic Test Chip for Optimal Test and Diagnosis" May 2018, pp. i-127. (Year: 2018).*

Mittal et Blanton, "NOIDA: Noise-resistant Intra-cell Diagnosis" May 2018, pp. 1-7. (Year: 2018).*

Shintani et al., "Artificial Neural Network based Test Escape Screening using Generative Model" Jan. 2019, pp. 1-8. (Year: 2019).*

Mittal et Blanton, "A Deterministic-Statistical Multiple-Defect Diagnosis Methodology" 2020, pp. 1-8. (Year: 2020).*

Bodhe et al., "Diagnostic Fail Data Minimization Using an N-Cover Algorithm" Mar. 2016, pp. 1198-1202. (Year: 2016).*

Garvie et al., "Automatic Synthesis of Totally Self-Checking Circuits" Jan. 2019, arXiv: 1901.07023v1, pp. 1-12. (Year: 2019).*

Huang et al., "Improving Diagnosis Efficiency via Machine Learning" Jan. 2019, pp. 1-10. (Year: 2019).*

Huang et Wei, "A PCB Dataset for Defects Detection and Classification" Jan. 2019, arXiv: 1901.08204v1, pp. 1-9. (Year: 2019).*

Stratigopoulos, Haralampos-G., "Machine Learning Applications in IC Testing" Jul. 2018, pp. 1-10. (Year: 2018).*

Tang et al., "Online PCB Defect Detector on a new PCB Defect Dataset" Feb. 2019, arXiv: 1902.06197v1, pp. 1-5. (Year: 2019).*

Wang et al., "Work-in-Progress: Hierarchical Ensemble Learning for Resource-Aware FPGA Computing" Nov. 2018, pp. 1-3. (Year: 2018).*

* cited by examiner

INTEGRATED CIRCUIT DEFECT DIAGNOSIS USING MACHINE LEARNING

RELATED APPLICATIONS

This application claims the benefit of the U.S. Provisional Patent Application No. 62/922,401, filed Aug. 7, 2019, the contents of which are incorporated herein in their entirety.

GOVERNMENT RIGHTS

This invention was made with government support under contract No. CCF-1816512 awarded by the National Science Foundation. The government has certain rights in this invention.

BACKGROUND OF THE INVENTION

With respect to the manufacture of integrated circuits, yield is defined as the proportion of working chips fabricated. Yield can be relatively low when a new manufacturing process or a new chip design is introduced. The process of identifying and rectifying the sources of yield loss to improve both chip design and manufacturing is called yield learning. The rate of yield learning is extremely critical to the success of the semiconductor industry and must thus be accelerated to meet the triple objectives of diminishing time-to-volume, time-to market and time-to-money requirements.

Various strategies are currently used to identify and characterize the sources of yield loss. Inline inspection, for example, optically examines a wafer to characterize defects.

However, with technology continuing to shrink, its effectiveness to locate a defect further decreases. Specialized test structures such as comb drives and ring oscillators are transparent to failure but do not reflect the diversity of the layout patterns found in an actual customer chip. More importantly, actual chips undergo additional fabrication steps that may introduce defect mechanisms that are simply not possible in simple test structures. Hence, in recent years, the use of legacy designs retrofitted for the latest technology node (and logic test chips) have been gaining traction as yield learning vehicles. Specifically, the knowledge of how a customer chip fails a manufacturing test is used to improve yield. This process is called failure analysis (FA). FA typically starts with software-based diagnosis.

Software-based defect diagnosis plays an important role in failure analysis. Diagnosis is a process to identify the location and, ideally, characterize the nature and root cause of a defective chip by examining its tester response. Based on the feedback produced by diagnosis, a small but significant number of chips are selected to be inspected physically. The aim of physical failure analysis (PFA) is to provide crucial understanding of failure mechanisms to improve the design and/or the manufacturing process to increase yield. Diagnosis is therefore an indispensable tool for facilitating yield learning.

Current diagnosis methods can essentially be differentiated based on the type of the fault model used (the (temporary) stuck-at fault model vs. the X-fault model), the scoring technique employed (deterministic vs. statistical), how precisely a defect is localized (i.e., whether a defect candidate is reported at a logic, back-end layout or front-end layout level), and whether multiple defects affecting a single chip can be analyzed/identified.

With decreasing feature sizes, and increasing interconnect density and manufacturing complexity, more chips are failing due to multiple defects, particularly when systematic defects (that arise from unforeseeable process-design interactions) are the dominant yield limiters (either in the early stages of yield learning or due to yield excursion).

Characterizing each defect in a chip affected by multiple defects is especially challenging, primarily for two reasons. First, erroneous values propagating from more than one defect location can interact with each other, resulting in either error masking (where one error blocks the propagation of another) or error unmasking (where one error assists the propagation of another). Second, the solution search space is exponential in defect multiplicity (unknown beforehand), which makes finding an optimum solution extremely difficult.

Numerous methods have been suggested to diagnose multiple defects. A first category of methods relies on identifying a defect via failing patterns (a) that can be explained by a single location, and (b) where errors propagating from multiple locations do not interfere with each other. However, such patterns can be limited and/or find an incorrect location due to a considerable number of interactions among errors manifesting from multiple defect locations. A second category of methods focuses on finding each defect incrementally but involve a significant number of multiple fault simulations, and hence do not scale well with design size and defect multiplicity. A third category of methods that guides efforts in exploring the exponential search space via optimization techniques faces a similar drawback and is thus impractical. A fourth category of methods avoids explicit fault simulation to identify multiple defects. For each failing pattern, each candidate location in a design is scored based on its ability to propagate an error to a design output while considering error masking and unmasking. Each method then, iteratively and greedily, selects the most likely set of defect locations based on a candidate ranking procedure.

Another way to avoid the inherent problem of error masking and unmasking in multiple-defect diagnosis is to employ the X-fault model. The X-fault model assumes an unknown (X) value at a potential defect location and allows errors to propagate conservatively.

Furthermore, prior work discussed up to this point uses various candidate-ranking heuristics to identify the best set of defect locations that can represent actual defects. However, such heuristics are explicitly created based on intuition and domain knowledge and are thus not guaranteed to work for every defect mechanism, design and/or process node.

On the contrary, a candidate scoring procedure implicitly derived from test fail data can uncover the hidden correlations between a correct candidate and the observed circuit response, which otherwise could have been overlooked by manually constructed scoring models. Thus, an alternative to rank candidates is machine learning.

Machine learning (ML) has been successfully applied in chip testing. Specifically, in the area of diagnosis, ML has been used to optimize test data collection to make diagnosis more efficient, improve the accuracy and resolution of diagnosis itself, and pinpoint yield-limiting layout geometries by analyzing a volume of diagnosis data.

SUMMARY OF THE INVENTION

Described herein is a novel, three-phase, physically-aware diagnosis methodology capable of effectively diagnosing multiple defects in an integrated circuit, and, in turn, aiding in accelerating the design and process development, and, as a result, increasing the yield.

The first phase identifies a defect that resembles traditional fault models. The second and the third phases utilize the X-fault model and machine learning to identify correct candidates. Results from a thorough fault injection and simulation experiment demonstrate that the method returns an ideal diagnosis twice as often as current methods of commercial diagnosis. Its effectiveness is further evidenced through a silicon experiment, where, on average, the method returns 5.3 fewer candidates per diagnosis as compared to state-of-the-art commercial diagnosis methods, without losing accuracy.

It should be noted that this summary is not intended to identify any critical or key elements, but instead merely presents certain introductory concepts so that the full scope of the disclosure may be appreciated upon reading the full specification and figures, of which this summary is part.

DEFINITIONS

Figure 1:
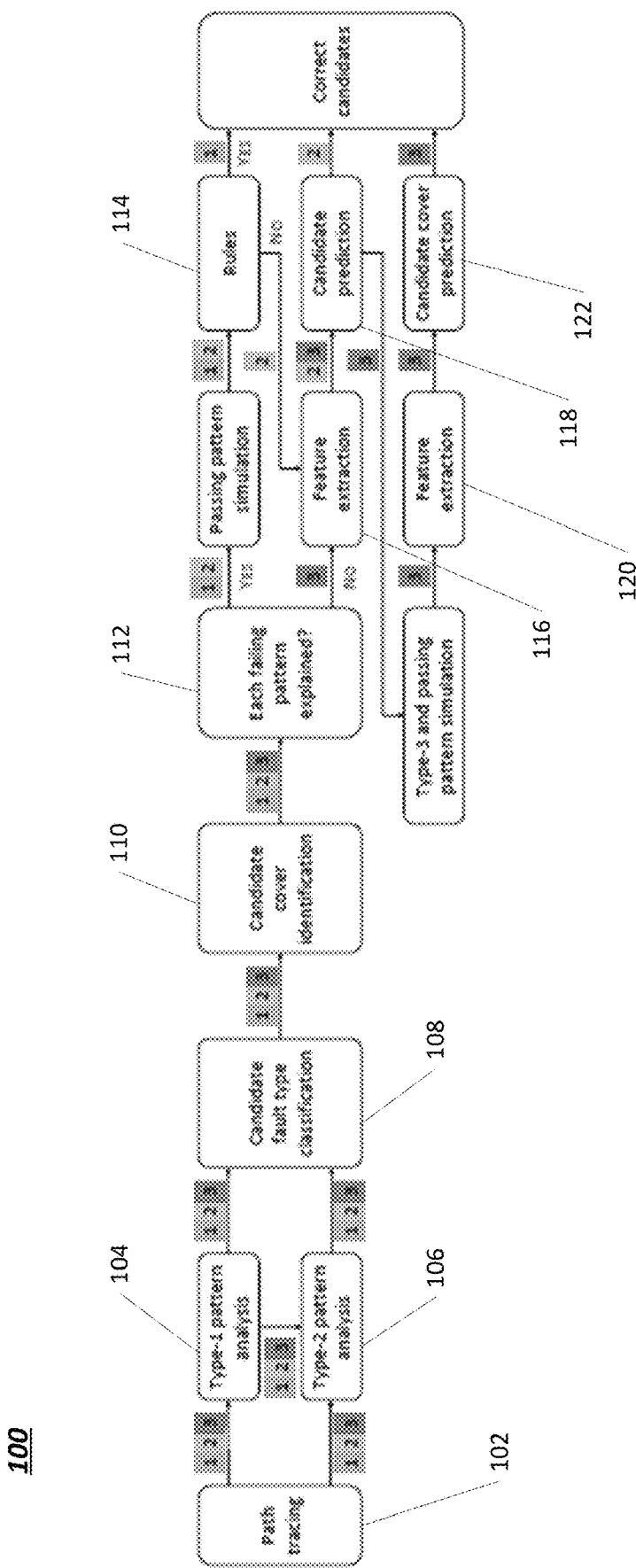
FIG. 1 is a block diagram showing an overview of the method of the present invention, showing the three-phase diagnosis methodology.

The following terms, as used herein, have the following meanings.

Fault Model—A fault model is an abstraction from actual defects at a high level comprising a set of assumptions that describes the behavior of a defect and/or its impact on the circuit. The observed behavior of a failed circuit is compared against these assumptions to check if they exactly match.

Pattern—A set of logic values applied to the inputs of a circuit.

Cover—A set of faults that collectively explain all the failing patterns, based on simulations in which the responses of several faults match the measured responses for some set of test patterns that have failed.

DETAILED DESCRIPTION

The method disclosed herein for characterizing multiple defects on a single chip is built on a single-defect diagnosis methodology introduced in U.S. Provisional Patent Ser. No. 62/922,401, the contents of which are incorporated herein by reference in their entirety. The single-defect method described in the provisional filing employs the X-fault model to avoid eliminating an actual defect location, and machine learning to identify the best candidate that could represent a defect. The single-defect model achieves superior performance for single-defect diagnosis when compared with prior art state-of-the-art commercial tools. It returns a single correct candidate for 86.6% more fail logs.

This method disclosed herein describes a single-chip, multiple-defect diagnosis methodology that is built on the single-defect model described in the provisional filing to effectively address the task of characterizing more than one defect. The method addresses the drawbacks of prior work related to multiple-defect diagnosis discussed in the Background.

Notable features of the method of the present invention include: (1) In addition to using a deterministic fault model (where the erroneous value is either logic-0 or logic-1), the X-fault model is employed as well to prevent the elimination of a correct candidate. X-values stemming from more than one location in a design cannot obstruct the propagation of another error, thus circumventing one of the main drawbacks of multiple-defect diagnosis (that of error masking and unmasking); (2) As opposed to manually developing a complex candidate scoring heuristic to identify the best candidate, the present invention utilizes machine learning to create a scoring model that learns the latent correlations between a correct candidate and the tester response; and (3) The method uses design layout information to identify the physical defect type and behavior of each candidate.

Back-end and front-end layout analysis techniques further strengthen the method by improving its physical resolution. It should be noted that an approach that improves the quality of diagnosis by either reordering, selecting or adding test patterns complement the method.

The end result of the method is an identification of one or more defect candidates, each defect candidate comprising a physical location of the defect in the circuit and a fault type of the defect. In one embodiment, each defect candidate is determined to be correct or incorrect, based on whether a prediction probability determined by a trained model is greater than a decision threshold.

Figure 2:
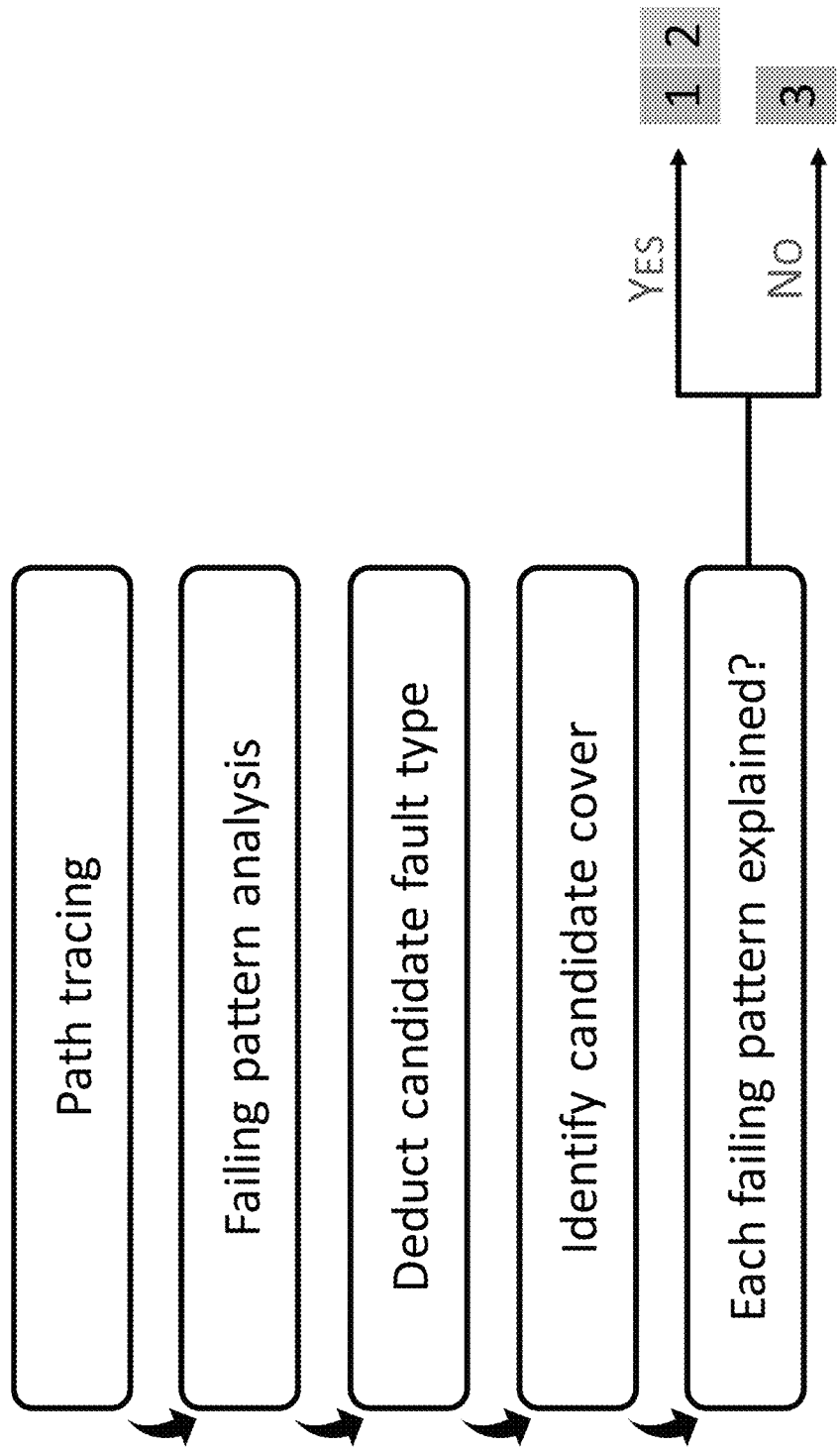
FIG. 2 shows the portions of the block diagram of FIG. 1 which are common to all three phases of the three-phase methodology.

FIG. 1 shows the overview of the present invention, which comprises a three-phase diagnosis methodology. The sequence of analysis steps involved in each phase are marked. FIG. 2 shows the first few steps of the method, which are common to all three phases. Phase 1 focuses on finding defects that mirror the behavior of well-established fault models. Such defects are henceforth referred to as class-1 defects. Phase 2 identifies a defect whose behavior deviates from that of each fault model considered in Phase 1 and whose error propagation path does not interfere with errors stemming from other defect locations for each failing pattern. Such defects are henceforth referred to as class-2 defects. Finally, any failing chip left undiagnosed is analyzed in Phase 3. Such a failing chip is affected by multiple defects where errors manifesting from at least two defects interact with each other such that no single candidate can explain the observed response for at least one failing pattern. Table 1 summarizes the class and multiplicity of defects targeted by each phase of the method.

TABLE 1

Class and Multiplicity of Defects Targeted by Each Phase

| Class 1 Defects | Class 2 Defects | Error Propagation Path | Phase |
|---|---|---|---|
| ≥1 | 0 | Disjoint for each failing pattern | Phase 1 |
| 0 | ≥1 | | Phase 2 |
| ≥1 | ≥1 | | Phases 1 & 2 |
| ≥1 | ≥1 | Overlapping for at least one failing pattern | Phase 3 |

Phase 1-3 Common Steps

The method 100 begins with path tracing 102, where each failing output for each failing pattern is traced back to infer potential defective sites. For each failing pattern, path tracing starts from each erroneous circuit output and traces back through the circuit towards the inputs, deducing the potential defective (logical) signals along the way. Physical defect locations corresponding to each implicated logical location are then extracted from layout analysis. Specifically, the topology and the physical neighborhood of each net are examined to identify probable open and bridge defect locations. Next, for each failing pattern, a stuck-at fault at each candidate location is simulated to find faults explain that pattern. Sets of stuck-at faults are selected using the minimum set-cover algorithm such that faults in each cover explain all the failing patterns. Path tracing 102 guarantees that it will find a defect location that assists in error propagation to at least one design output, even for multiple defects.

For each failing pattern, an X fault is simulated at each candidate location (one at a time) to identify faults that can explain that pattern. (An X fault "explains" a failing pattern when the set of simulated outputs that possess an X value subsume the erroneous circuit outputs). Each such explained pattern is classified as a type-1 pattern at 104. It should be noted that, in prior art methods, a type-1 pattern is defined with respect to a (temporary) stuck-at fault, not an X fault. However, the X-fault model is not susceptible to error masking and averts the elimination of a candidate that represents an actual defect.

Each failing pattern is further analyzed to find a group of locations such that their error propagation paths are disjoint and such that they can collectively explain that failing pattern. Each such pattern is classified as a type-2 pattern 106. This procedure is performed with respect to both stuck-at and X fault simulations. (A failing pattern is analyzed multiple times so that the final cover consisting of defect candidates resulting from the next couple of steps is optimal). The remaining failing patterns, if any, are classified as type-3 patterns. Each failing pattern is thus categorized as either type-1, type-2 or type-3, depending on whether the pattern is explained by one fault, or multiple faults, or not explained at all.

Next, physical defect locations associated with logical candidates that explain a type-1 or type-2 pattern are extracted from the design layout by examining their topology and the physical neighborhood. Each logical candidate is then mapped to a physical defect candidate while keeping track of the set of failing patterns it explains. For example, if a logical candidate "A" explains pattern t1, and candidate "B" explains pattern t2, and "A" and "B" form a physical bridge pair, then the defect candidate (A;B) explains both the patterns t1 and t2.

Figure 3:
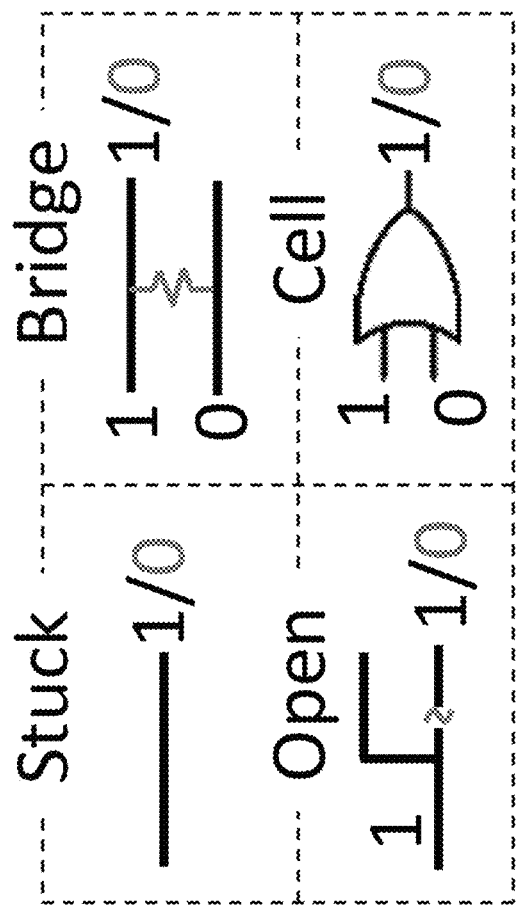
FIG. 3 is a graphical explanation of the various types of faults.

In one embodiment, possible candidate fault types considered in one embodiment of the invention are STUCK, CELL, BRIDGE and OPEN. Other embodiments of the invention may utilize more or less possible fault types or fault types different from those of the explained embodiment. The simulated responses are analyzed to classify each candidate as either STUCK, CELL, BRIDGE, or OPEN at 108. FIG. 3 graphically shows the differences between the types of faults.

Figure 4:
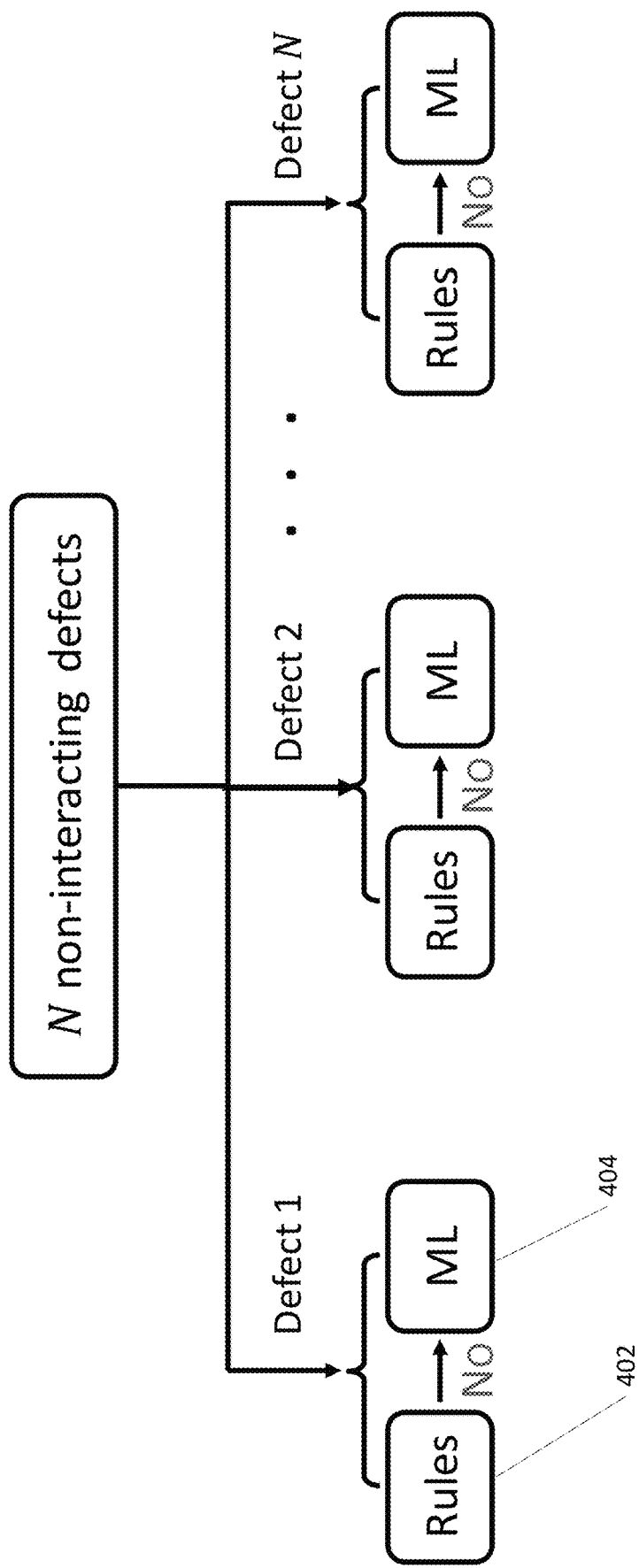
FIG. 4 shows Phases 1 and 2 of the method of the present invention where multiple failing patterns are present but non-interacting.
Figure 5:
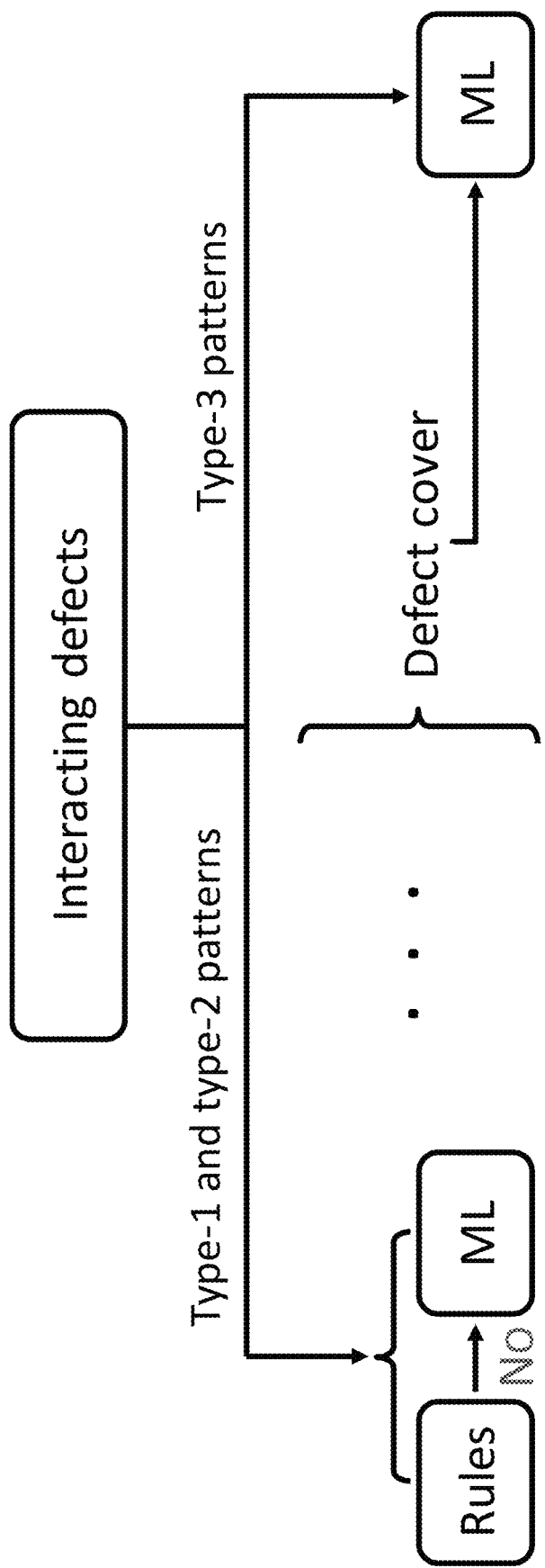
FIG. 5 shows the use of Phase 3 of the method of the present invention when multiple, interacting defects are present.

The next step is to determine covers at 110 consisting of defect candidates via the set-cover approach such that (a) the size of a cover is minimum, i.e., a cover consists of a minimum number of defect candidates, and (b) defect candidates in a cover collectively explain each failing pattern that is either type-1 or type-2. A candidate cover is then selected that explains a set of failing patterns. If each failing pattern is explained, (i.e., classified as either type-1 or type-2) at 112, then there are no type-3 patterns, and it implies that the chip under diagnosis is affected by defects with disjoint error propagation paths for each failing pattern. If each failing pattern is explained, then the method uses to Phases 1 and 2 for those patterns, otherwise, Phase 3 is used. The design (and the tester response) can essentially be partitioned such that each individual defect is diagnosed independently either in Phase 1 or Phase 2. If each failing pattern is either type-1 or type-2, this indicates that faults do not interact with each other for any failing pattern. Hence, each defect can be diagnosed, as shown in FIG. 4. For each defect, the behavior of the defect is checked against some rules at 402 established for common fault models. If the rules are not satisfied, then a machine learning model is used at 404. For type-1 and type-2 patterns, each defect is analyzed separately. FIG. 5 shows the use of Phase 3 when interacting defects are present. The left branch of the tree is similar to FIG. 4 for Phases 1-2. Then, the defect covers are simulated for type-3 patterns by using ML.

Phase 1

Phase 1 focuses on diagnosing defects that mimic the behavior of traditional fault models. Specifically, a set of strict rules, shown in Table 2, are constructed for each candidate defect type to identify the correct cover of candidates. A defect candidate of a cover is deemed correct if it satisfies the rules at 114, and therefore represents a class-1 defect. Defect candidates of a cover that do not comply with the rules are further analyzed in Phase 2, which is especially geared towards the diagnosis of class-2 defects. It should be noted that the covers with the least number of class-2 defects are passed on to Phase 2.

TABLE 2

Rules for Each Candidate Fault Type in Phase 1

| Fault Type | Rule |
|---|---|
| STUCK | Candidate passes for each passing pattern |
| OPEN | Candidate passes for each passing pattern |
| CELL | Cell passes consistency check |
| BRIDGE | Bridged nets have the opposite polarity for failing patterns. Bridged nets have the same polarity for passing patterns that sensitize one of the nets to a design point. |

Common rule: Candidate explains each failing pattern. Here, a stuck-at fault is said to explain a failing pattern if the outputs that failed during simulation are identical to the observed failing outputs that are reachable from the fault location.

These rules are further explained as follows.

STUCK: when a cover contains only one fault. If the fault simulation response is identical to the tester response, the candidate is deemed correct.

CELL: when a cell candidate is consistent. That is, sets of logic values established on the cell inputs for Tester-Fail/Simulation-Fail (TFSF) and Tester-Pass/Simulation-Fail (TPSF) patterns are disjoint. Here, a TFSF (TPSF) is a pattern that fails (passes) on the tester and detects a stuck-at fault at the candidate location. Any cell candidate that is found consistent is adjudged correct. Each consistent cell can further be inspected to derive intra-cell candidates.

BRIDGE: when a cover consists of faults corresponding to physically adjacent nets. The candidate is deemed correct if the bridged nets have opposite polarities for each TFSF pattern and same polarities for each TPSF pattern.

OPEN: when a cover contains faults affecting the same signal. In addition to explaining each failing pattern, the candidate is deemed correct if at least one of the cover's constituent faults passes (but is excited) for each passing pattern.

If no candidate of a failing chip complies with these rules, it is passed on to the Phase 2 of the diagnosis flow that especially deals with defects having complex behavior.

Figure 6:
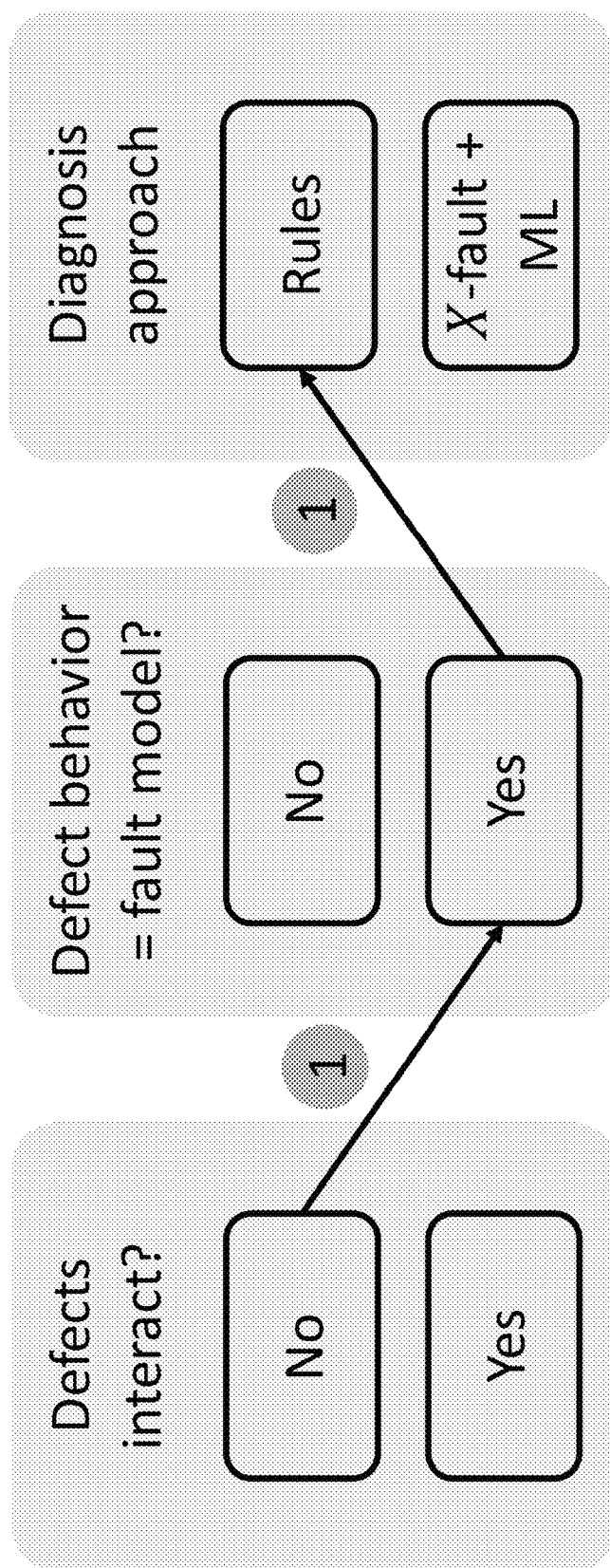
FIG. 6 shows the circumstances when Phase 1 of the method is sufficient to diagnose a defect.

FIG. 6 shows when only Phase 1 is necessary to successfully diagnose and classify a defect. When multiple defects are present, if the defects do not interact with each other and the defect behavior matches with a fault model, then the rule-based method is used.

Phase 2

Phase 2 begins similarly to Phase 1 with path tracing. Next, each candidate is simulated for each failing pattern using the X fault model. The resulting simulation responses are compared to the tester response to find candidates that explain that pattern. The X-value simulation of a candidate is said to explain a failing pattern if the erroneous circuit outputs are subsumed by the set of simulated outputs that possess an X value. Then, sets of X faults are selected using the minimum set-cover algorithm such that faults in each cover collectively explain all the failing patterns.

Each candidate cover is further analyzed using stuck-at simulation. Specifically, for each failing pattern, stuck-at faults at the locations corresponding to the X faults in a cover are simulated. The stuck-at fault responses are then compared to the observed circuit response to find the fault that best explains that pattern. Here, the criterion for best explaining a pattern is that the hamming distance between the fault simulation response and observed test response is minimum. Thus, each candidate, up to this point, is characterized by a cover of X faults and a cover of stuck-at faults.

A defect candidate, at this point of diagnosis, has the following properties: (a) it portrays behavior that cannot be modeled by the fault models employed in Phase 1; and (b) an error disseminating from the candidate location does not block or assist in error propagation of other possible defects in the circuit for any failing pattern. The primary objective of Phase 2 is to apply machine learning to discern the correct candidate.

The next step in Phase 2 is assigning a fault type (STUCK, CELL, BRIDGE, and OPEN) to each candidate, which is accomplished in exactly the same way as Phase 1. Next, a set of features for each candidate is extracted using test and manufacturing domain knowledge. The extracted set of features are specific properties of a candidate that aim to distinguish a correct candidate from an incorrect one. Each feature value is calculated by comparing the test outputs/patterns observed by the tester and predicted by simulation.

The features used here are derived from both the X-fault and the stuck-at fault simulation of a candidate. In addition, the features extracted here are more detailed. For example, the number of tester-pass/simulation-fail (TPSF) outputs are counted separately for tester-fail/simulation-fail (TFSF) and tester-pass/simulation-fail (TPSF) patterns, instead of recording the total number of TPSF outputs over patterns that fail during simulation.

The next step in Phase 2 is to classify a candidate as correct/incorrect using machine learning. For each defect type (STUCK, CELL, BRIDGE or OPEN), a separate ML model is trained so that distinct characteristics relevant to each defect behavior can be learned. Training data is generated from diagnosing numerous virtual fail logs that are created by injecting and simulating multiple defects in the circuit. Hyperparameters of each model are optimized using a separate validation dataset. Each trained model inherently acts like a scoring framework and assigns a probability (or a "score") to each detect candidate. Any candidate having a score exceeding the decision threshold is deemed a correct candidate.

In one embodiment, the supervised machine learning model is a random forest, Features are extracted at 116 from the test data by comparing the test patterns and outputs observed on the tester and predicted by the simulation at 118. In one embodiment, 44 features are extracted. The features are derived from the stuck-at and the X fault simulation of a defect candidate, and, likely, completely represents its behavior. The features used in this embodiment of the invention are shown in Table 3. Twenty-two features are extracted for each type of simulation (stuck-at and X-fault), resulting in a total of 44 features. All 44 features are used to train each fault-specific model.

Because only a single candidate can represent an actual defect, the training and the validation datasets are highly imbalanced. An optimum decision threshold for each trained model is thus selected. In one embodiment, the selection is made using a Precision-Recall curve. Each defect candidate (according to its defect type) is then adjudged correct/incorrect by the corresponding trained ML model.

TABLE 3

Features Extracted by Machine Learning Models

| No. | Feature |
|---|---|
| 1 | Number of TFSF patterns/Number of TF patterns |
| 2 | Number of TFSF patterns/Number of SF patterns |
| 3 | Number of TPSF patterns/Number of TP patterns |
| 4 | Number of TPSF patterns/Number of SF patterns |
| 5 | Number of TFSP patterns/Number of TF patterns |
| 6 | Number of TFSP patterns/Number of SP patterns |
| 7 | Number of TFSF outputs for TFSF patterns/Number of TF outputs |
| 8 | Number of TFSF outputs for TFSF patterns/Number of SF outputs |
| 9 | Number of TPSF outputs for TFSF patterns/Number of TP outputs |
| 10 | Number of TPSF outputs for TFSF patterns/Number of SF outputs |
| 11 | Number of TFSP outputs for TFSF patterns/Number of TF outputs |
| 12 | Number of TFSP outputs for TFSF patterns/Number of SP outputs |
| 13 | Number of TPSP outputs for TFSF patterns/Number of TP outputs |
| 14 | Number of TPSP outputs for TFSF patterns/Number of SP outputs |
| 15 | Number of TPSF outputs for TPSF patterns/Number of TP outputs |
| 16 | Number of TPSF outputs for TPSF patterns/Number of SF outputs |
| 17 | Number of TFSP outputs for TPSF patterns/Number of TP outputs |
| 18 | Number of TPSP outputs for TPSF patterns/Number of SP outputs |
| 19 | Number of TFSP outputs for TFSP patterns/Number of TF outputs |
| 20 | Number of TFSP outputs for TFSP patterns/Number of SP outputs |
| 21 | Number of TPSP outputs for TFSP patterns/Number of TP outputs |
| 22 | Number of TPSP outputs for TFSP patterns/Number of SP outputs |

TF: tester-fail; TP: tester-pass; SF: simulation-fail; SP: simulation-pass
TFSF: tester-fail/simulation-fail; TPSF: tester-pass/simulation-fail
TFSP: tester-fail/simulation-pass; TPSP: tester-pass/simulation-pass Finally, a cover of defect candidates is said to represent actual defects when each defect candidate in the cover is deemed correct in either Phase 1 or Phase 2.

Figure 7:
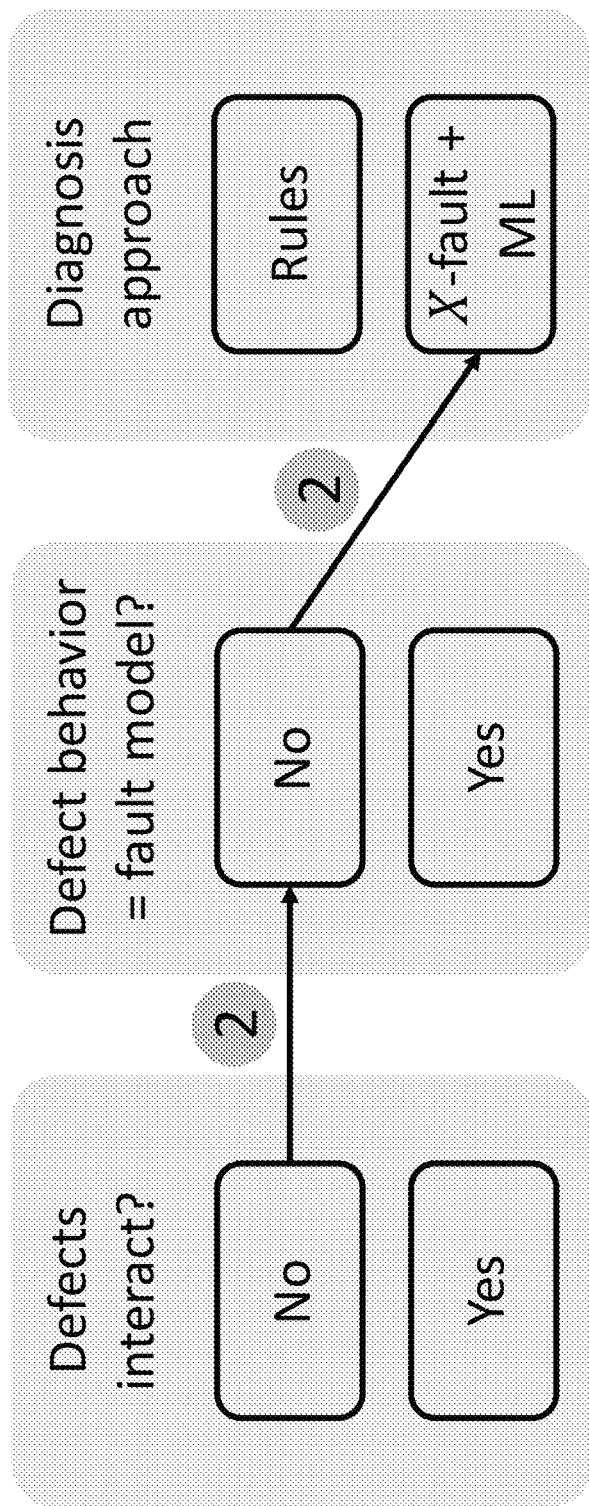
FIG. 7 shows the circumstances when Phase 2 of the method is sufficient to diagnose the defect.
Figure 9:
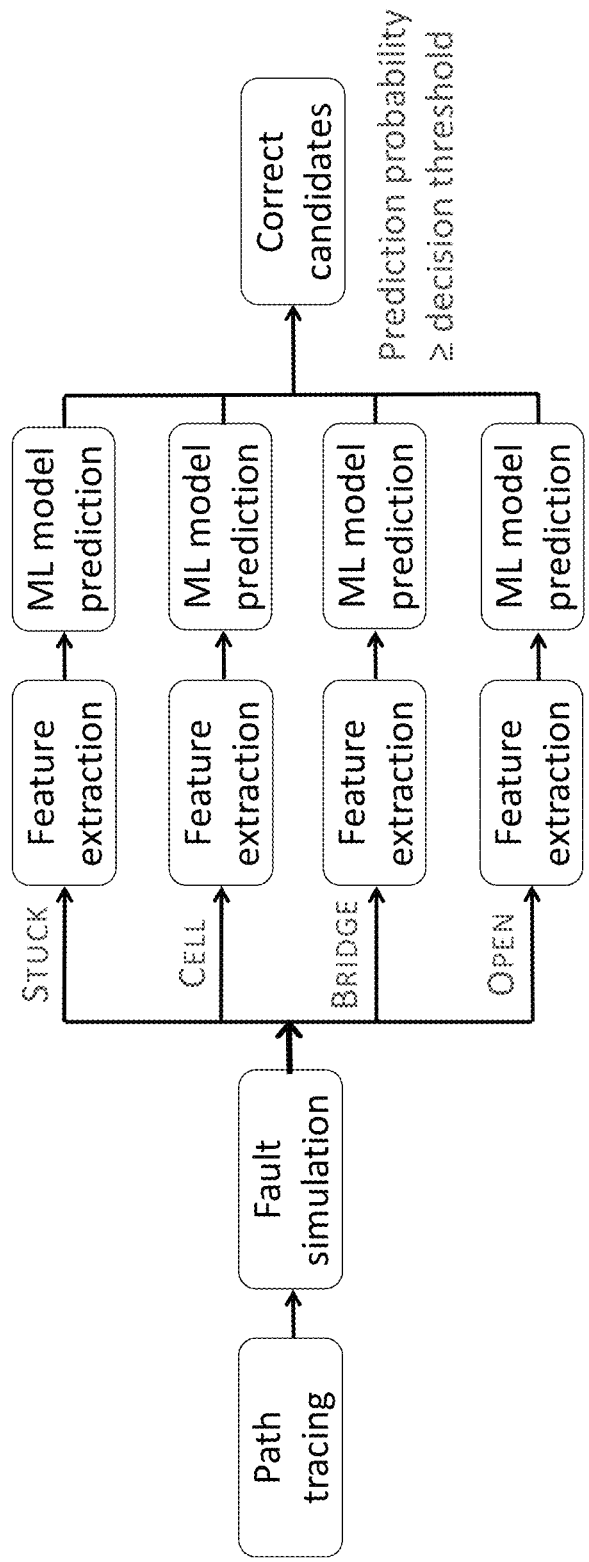
FIG. 9 is a block diagram showing the use of machine learning models in Phases 2 and 3 of the method.

FIG. 7 shows when Phase 2 is sufficient to diagnose and classify a defect. When only a single defect is present or, when multiple defects are present, if the defects do not interact with each other, and the defect behavior does not match with the common fault model, then X fault simulation and machine learning is used to correctly classify the defect. FIG. 9 shows the use of the ML models in Phase 2 to predict the proper classification of the defect. The trained models classify a candidate as correct or incorrect based on whether its prediction probability is greater than the decision threshold (or not).

Phase 3

If there is at least one type-3 pattern, it implies that the chip under diagnosis is affected by multiple defects with overlapping error propagation paths for at least one failing pattern.

In Phase 3, ML classification is applied at two different levels. First, at a defect level, where fault-type specific ML models built using the approach outlined in Phase 2 using feature extraction at 116 to classify each defect candidate as correct/incorrect, and, second, at a cover level 120, where the entire cover is predicted as correct/incorrect.

However, there are a few differences when defect-level classification is applied in Phase 3. First, a candidate cover is only simulated for type-1 and type-2 patterns up to this point, and not type-3 and passing patterns. In one embodiment, 32 features that correspond to the failing patterns are used to train a defect-level ML model, although the ML model could be trained with any number of features. In this embodiment, the 32 features correspond to the failing patterns (i.e., rows 1-2, 5-6, 7-14, 19-22 in Table 3) are used to train multiple fault-type-specific, defect-level ML models.

Second, to be conservative and avoid eliminating a correct candidate cover, a cover is analyzed further if at least one of its component defect candidates is predicted correct by the ML model. Each cover is then simulated for the remaining patterns (type-3 and passing patterns). Here, machine learning is utilized at a candidate cover level. A single model (preferably a random forest) is trained using the steps similar to that described in Phase 2, with the difference being that each training/validation instance is a candidate cover in Phase 3. In one embodiment, all 44 features listed in Table 3 may be used to train the cover-level model. A cover is then said to represent actual defects when it is predicted correct by the ML model.

It should be noted that multiple-fault simulation is performed here to extract features, and not to explore the exponential search space. Unlike prior art methods, type-3 patterns are used here to further improve the quality of diagnosis. The method can effectively handle multiple byzantine defects without exhaustive enumeration of all fault combinations at a possible open defect location.

Figure 8:
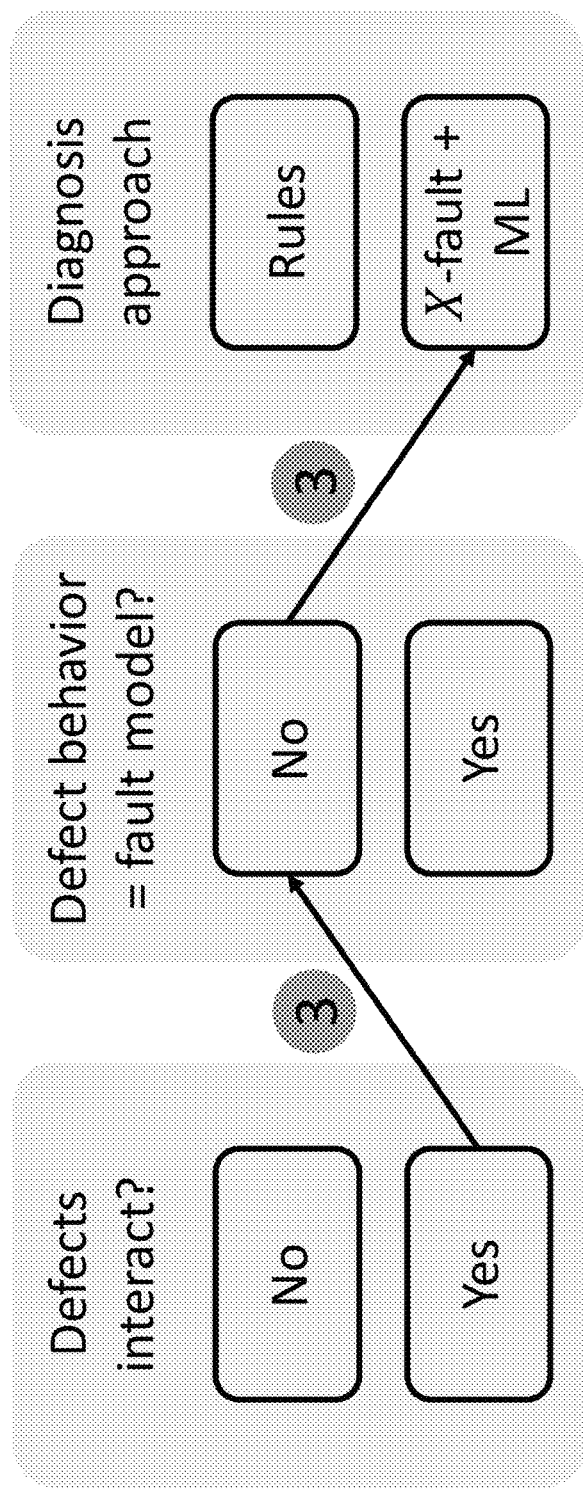
FIG. 8 shows when Phase 3 of the method must be used to diagnose the defect.

FIG. 8 shows when Phase 3 is necessary to diagnose and classify the defect. When multiple defects are present, if the defects interact with each other, and the direct defect behavior does not match with common fault modes, then X fault simulation machine learning is used to correctly classify the defect.

Figure 10:
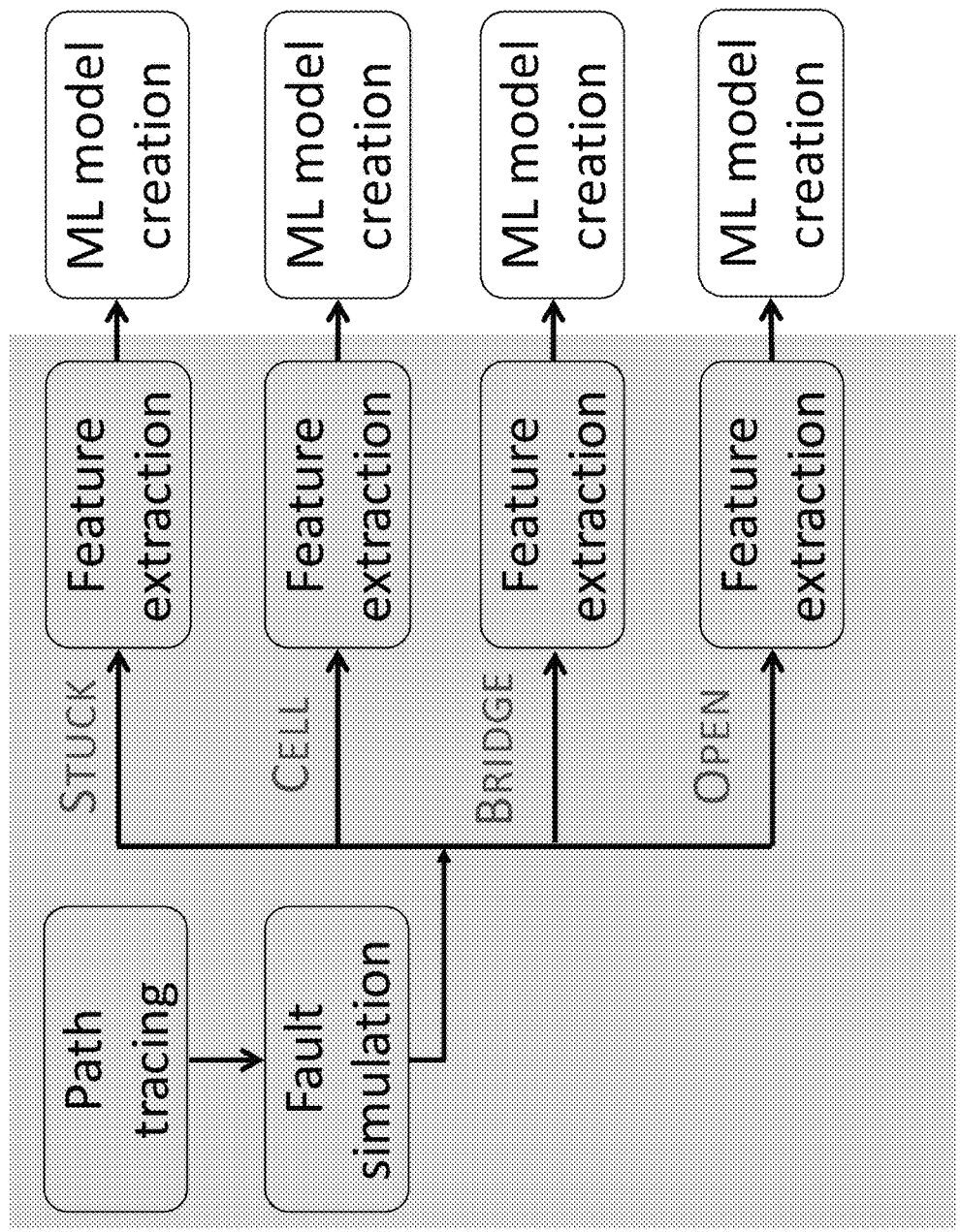
FIG. 10 is a block diagram showing the training of the machine learning models used in Phases 2 and 3 of the method.

FIG. 10 shows the training of the four machine learning models. Numerous virtual fail logs are created by injecting a variety of fault behaviors. The training models are learned separately for each fault type. In one embodiment, a random forest is used as a learning model due to its proven robust performance. A random forest is simply an ensemble of decision trees, where each tree is trained with a subset of the training data. The decision or the classification threshold are also learned instead of using the more commonly used threshold of 0.5 for optimized performance.

Experiments

Two experiments were used to validate the method. One is a fault injection and simulation experiment using three different designs, and a second uses actual silicon failure data.

Simulation

A simulation-based experiment was performed using three designs—one is an Advanced Encryption Standard (AES) core that provides AES-128 encryption, the second design is the L2B cache write-back buffer (called L2B) of the OpenSPARC T2 processor, and the third design is an ITC'99 benchmark called B18. Realistic physical defect behaviors associated with bridge, open and cell defects (including byzantine bridges and opens) are modeled. For each design and defect multiplicity, 1,000 virtual fail logs were generated by uniquely and randomly selecting the defect locations and their behaviors. For each design, an additional 500 fail logs were used to produce the training dataset and another 500 to produce the validation dataset, while ensuring that each multiple fault injected is different.

Each fail log was diagnosed using the method disclosed herein as the invention and two state-of-the-art commercial diagnosis tools. The diagnosis quality was assessed using three metrics, namely, diagnosability, resolution and perfect diagnosis. Diagnosability is defined as the ratio of the number of defect locations that are correctly identified to the number of defect locations injected. Resolution is defined as the ratio of the number of defect locations that are correctly identified to the number of defect locations reported. An ideal diagnosis occurs when diagnosability and resolution are simultaneously equal to one.

Figure 11:
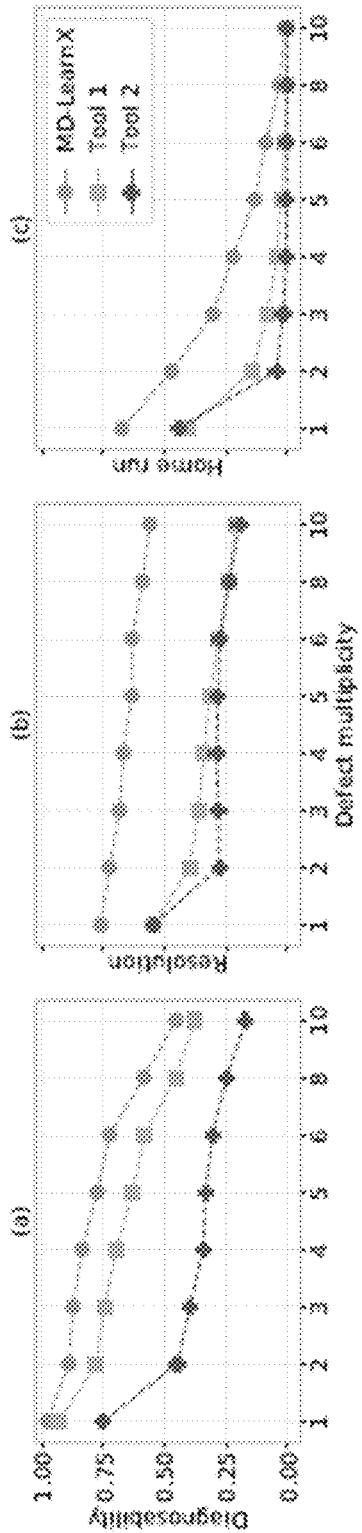
FIG. 11 are graphs showing the diagnosability, resolution and ideal diagnosis rates of the method compared with commercial diagnosis when used on simulated defects.

FIG. 11($a$) compares the average diagnosability (y-axis) achieved by the present invention with commercial diagnosis for the AES core for various defect multiplicities (x-axis). FIG. 11($a$) clearly shows that the method of the present invention performs better than commercial diagnosis. FIG. 11($a$) reveals that the average diagnosability using the method is 0.77, which is 18.4% (1.1×) more than Tool 1 (Tool 2). When a circuit is affected by five or more defects, the method performs even better, where the enhancement over Tool 1 (Tool 2) is 23.5% (1.4×). Further analysis indicates that the method correctly identifies all the injected defect locations (i.e., diagnosability=1) for 52.9% fail logs, which is 22.2% (2.5×) higher than Tool 1 (Tool 2).

FIG. 11($b$) compares the average resolution (y-axis) attained by the method with commercial diagnosis for various defect multiplicities (x-axis). FIG. 11($b$) shows that the average resolution of the method is 0.67, which is 97.0% (1.2×) more than Tool 1 (Tool 2). The method performs even better when a circuit is affected by five or more defects, wherein the resolution of the method is 2.3× (2.4×) times Tool 1 (Tool 2). Further analysis reveals that the method achieves ideal resolution for 3× as many fail logs as commercial diagnosis.

FIG. 11($c$) shows that the method delivers an ideal diagnosis for 26.1% fail logs, which is 2.9× (4×) times Tool 1 (Tool 2). For defect multiplicity more than 5, where commercial diagnosis clearly does not return an ideal diagnosis, the method produces an ideal diagnosis for 4.3% fail logs.

Figure 12:
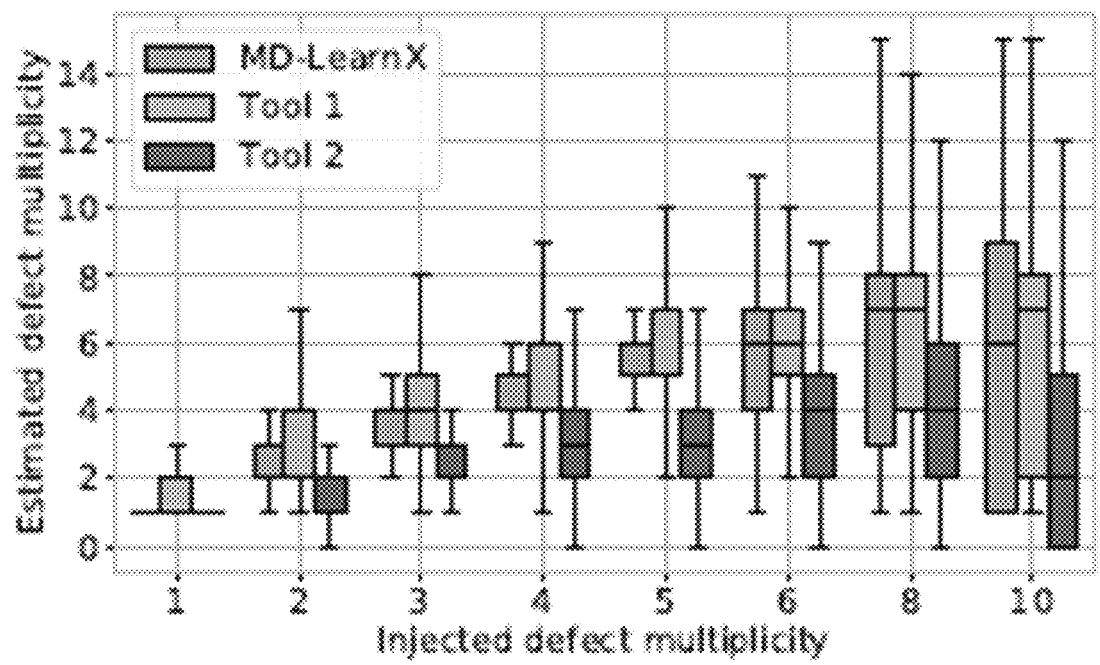
FIG. 12 is a graph showing the distribution of defect multiplicity estimated by the method of the present invention versus commercial diagnosis tools when used on simulated defects.

FIG. 12 reveals that as defect multiplicity increases, the likelihood of misprediction increases. For example, the method correctly estimates the number of defects for 65.2% of fail logs when the actual defect multiplicity is two, compared to 47.5% (53.5%) by Tool 1 (Tool 2); when the number of injected defects is 10, the method correctly predicts for 9.0% of fail logs, compared to 7.9% (1.3%) by Tool 1 (Tool 2). On average, the method correctly determines the defect multiplicity for 36.7% fail logs, which is 37.5% (20.8%) more than Tool 1 (Tool 2).

When the runtime (wall clock time or elapsed real time, to be precise) of the method is compared with commercial diagnosis, it was observed that, on average, the method is 25.2% slower than Tool 1 and 59.7% faster than Tool 2. This comparison, however, does not include the one-time cost (per design) of creating the machine learning models for Phases 2 and 3. For instance, for the largest design, AES, it took 5.7 hours to train the models. However, the primary goal is to show the effectiveness (in terms of the diagnostic metrics) rather than the runtime efficiency of the method. Silicon The method was also applied to actual failing chips to evaluate its performance. The silicon failure data comes from a 40M gate test chip design manufactured in 14 nm technology. For each fail log, it is seen that the method (and commercial diagnosis) correctly localizes the defects that are PFAed. More importantly, the method returns fewer candidates than commercial diagnosis, on average, without sacrificing accuracy.

Figure 13:
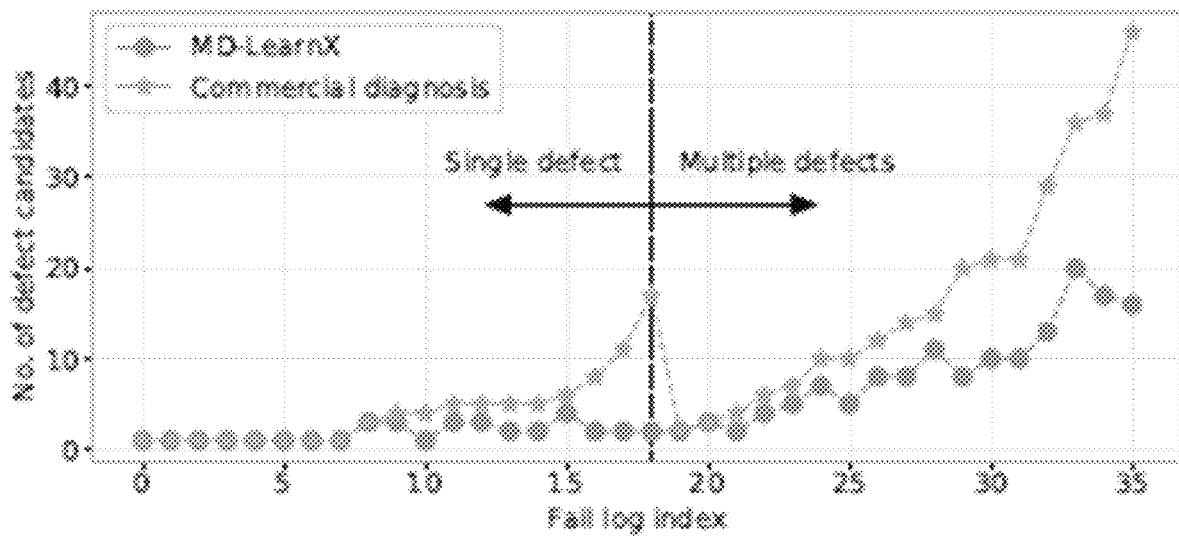
FIG. 13 is a graph showing the number of candidates returned by the method of the present invention for silicon-based fail logs.

FIG. 13 compares the number of defect candidates (y-axis) returned by the method and commercial diagnosis for each fail log (x-axis) for which the PFA results are available. FIG. 13 reveals that the method returned fewer defect candidates than commercial diagnosis for 25 (69.4%) fail logs, while returning the same candidates for other fail logs, without losing accuracy. On average, 5.3 fewer candidates per fail log were returned, with maximum improvement being 88.2%. Furthermore, for the 17 fail logs diagnosed with multiple defects, the improvement is more profound. Specifically, 8.5 fewer candidates per fail log are returned, on average. To summarize, the method is shown to be effective in a simulation-based and a silicon experiment, with significant enhancement over state-of-the-art commercial diagnosis.

A single-chip diagnosis methodology to effectively diagnose multiple defects in integrated circuits has been described herein. It is a physically-aware, three-phase diagnosis methodology. Phases 1 and 2 focus on diagnosing a chip affected by a single defect or multiple defects that do not interact with each other. Phase 1 centers on finding a defect that echoes the behavior of classic fault models via a set of deterministic rules, while Phase 2 concentrates on identifying a defect through machine learning. A scoring model (separate for each defect type) that learns the hidden correlations between the tester response and the correct candidate is created to pinpoint the correct candidate.

Phase 3 diagnoses a chip affected with multiple interacting defects. Similar to Phase 2, Phase 3 applies machine learning at a defect candidate level using failing patterns that can be explained by multiple, non-interacting defect candidates. Then, Phase 3 employs machine learning at a candidate cover level using the passing and the remaining failing patterns to identify the cover of defect candidates that corresponds to actual defects.

Software diagnosis, which is the first step in failure analysis, is the backbone of yield learning and monitoring. High diagnosis quality can effectively guide and accelerate PFA, likely facilitating yield ramp.

We claim:
1. A method comprising:
applying one or more patterns to the circuit;
identifying one or more failing patterns of a circuit as patterns that cause failing outputs from the circuit;
tracing failing outputs of the circuit to one or more candidate defect locations in the circuit;
classifying each failing pattern as a type-1 pattern, indicating that the failing pattern is explained by a single fault, a type-2 pattern, wherein the failing pattern is explained by multiple faults, or a type-3 pattern, wherein the failing pattern is not explained, indicating interacting defects are present in the circuit, the classifying comprising:
identifying one or more covers comprising a set of the candidate defect locations in the circuit that collectively explain all failing patterns;
assigning a fault type to each candidate defect location, the fault type selected from a group consisting of STUCK, CELL, BRIDGE and OPEN;
extracting, for a supervised machine learning model, a set of features from each candidate defect location based on patterns predicted by stuck-at and X-fault simulations of the candidate defect locations compared to observed failing patterns;
for each type-3 pattern:
applying a defect-level, fault type-specific machine learning model for each fault type to each candidate defect location, each fault type-specific machine learning model taking as input the features extracted from the candidate defect location and outputting a probability that the candidate defect location is the fault type which the fault type-specific machine learning model has been trained to detect; and
applying a cover-level machine learning model when the probability produced by at least one of the fault type-specific machine learning models returns a probability exceeding a predetermined threshold for at least one of the candidate defect locations in the cover, to classify the set of candidate defects in the cover as being correct or incorrect;
wherein a correct output from the cover-level machine learning model indicates that the cover represents actual defects in the circuit.
2. The method of claim 1, wherein assigning a fault type to the candidate defect locations comprises:
applying a set of rules to determine a candidate defect location representative of the identified defect.
3. The method of claim 1, wherein identifying one or more covers comprises:
determining a group of locations in the circuit that collectively explains the one or more failing patterns.
4. The method of claim 3 wherein error propagation paths of each location in the group are disjoint from each other.
5. The method of claim 1 wherein the fault-specific machine learning models are trained using data sets comprising fail logs from a simulation of single and/or multiple defects in the circuit.
6. The method of claim 5 wherein the data sets contain only non-interacting defects.
7. The method of claim 1 wherein the one or more identified defects are interacting when two or more of the defects have overlapping error propagation paths for at least one failing pattern.
8. The method of claim 1 wherein 44 features extracted from each candidate defect location, 22 features from the stuck-at simulation and 22 features from the X-fault simulation.

9. The method of claim 8 wherein 32 of the 44 features are used to train each of the defect-level machine learning models and further wherein all 44 features are used to train the cover-level machine learning model.

10. The method of claim 1 wherein the supervised machine learning model is a random forest.

\* \* \* \* \*